(12) United States Patent
Kato (10) Patent No.: US 6,486,562 B1
(45) Date of Patent: Nov. 26, 2002

(54) CIRCUIT DEVICE WITH BONDING STRENGTH IMPROVED AND METHOD OF MANUFACTURING THE SAME

(75) Inventor: Kaneyuki Kato, Tokyo (JP)

(73) Assignee: NEC Corporation, Tokyo (JP)

( * ) Notice: Subject to any disclaimer, the term of this patent is extended or adjusted under 35 U.S.C. 154(b) by 231 days.

(21) Appl. No.: 09/588,357

(22) Filed: Jun. 7, 2000

(30) Foreign Application Priority Data

Jun. 7, 1999 (JP) .......................................... 11-159777

(51) Int. Cl.[7] ........................... H01L 23/48; H01L 21/44
(52) U.S. Cl. ........................ 257/778; 257/712; 257/796; 438/108; 438/122; 438/124
(58) Field of Search ................................ 438/107, 108, 438/121, 122, 124, 126, 127; 257/717, 712, 718, 778, 796

(56) References Cited

U.S. PATENT DOCUMENTS

| | | | | |
|---|---|---|---|---|
| 5,455,462 A | * | 10/1995 | Marrs .......................... | 257/796 |
| 5,883,430 A | * | 3/1999 | Johnson ....................... | 257/796 |
| 5,909,056 A | * | 6/1999 | Mertol ......................... | 438/122 |
| 5,989,940 A | * | 11/1999 | Nakajima .................... | 438/118 |
| 6,046,077 A | * | 4/2000 | Baba ............................ | 438/108 |
| 6,069,023 A | * | 5/2000 | Bernier et al. ............... | 438/107 |
| 6,104,093 A | * | 8/2000 | Caletka et al. .............. | 257/778 |
| 6,127,724 A | * | 10/2000 | DiStefano .................... | 257/796 |

FOREIGN PATENT DOCUMENTS

| | | |
|---|---|---|
| JP | A 8-306828 | 11/1996 |
| JP | 9-64236 | 3/1997 |
| JP | A 9-64237 | 3/1997 |
| JP | 9-293808 | 11/1997 |
| JP | 11-97570 | 4/1999 |

* cited by examiner

*Primary Examiner*—Kevin M. Picardat
(74) *Attorney, Agent, or Firm*—Young & Thompson (57) ABSTRACT

A circuit device with a ball grid array (BGA) package structure includes an interposer substrate, at least a flip chip, a unitary mold resin and a heat spreader. The interposer substrate has a plurality of first connecting pads arrayed on an upper surface thereof in a first density. The flip chip has a plurality of second connecting pads arrayed on a lower surface thereof in the first density, and is mounted on the interposer substrate via solder bumps for connecting the plurality of first connecting pads and the plurality of second connecting pads. The unitary mold resin fills a space between the lower surface of the flip chip and the upper surface of the interposer substrate and peripheral portions of the flip chip on the upper surface of the interposer substrate. The heat spreader has a lower surface directly coupled to an upper surface of the flip chip with a metal paste and coupled to upper surfaces of the peripheral portions.

21 Claims, 9 Drawing Sheets

CIRCUIT DEVICE WITH BONDING STRENGTH IMPROVED AND METHOD OF MANUFACTURING THE SAME

BACKGROUND OF THE INVENTION

1. Field of the Invention

The present invention relates to a circuit device having a structure in which a flip chip and an interposer substrate are molded and a method of manufacturing the same.

2. Description of the Related Art

Conventional circuit devices such as an IC (integrated circuit) have been manufactured in the form of separate chip components for use in a variety of electronic instruments. In such a circuit device, a multiplicity of lead terminals are provided about a flip chip of a semiconductor circuit which has a plurality of connecting pads. These lead terminals and the connecting pads are connected by bonding wires, and the flip chip and inward portions of the lead terminals are molded with a resin material. In conventional circuit device having the above structure, the lead terminals project outwardly from the edge of the resin material. Therefore, when the circuit device is mounted on a printed circuit board (PCB) so that the lead terminals are connected to printed patterns, data transmission between a semiconductor circuit of the circuit device and the printed circuit board can be carried out.

However, since the circuit devices are now made smaller in the size and higher in the integration so that the number and density of lead terminals are increased, it becomes difficult for a user to precisely connect the lead terminals to the printed patterns of the printed circuit board. Additionally, the lead terminals are too narrow to have an improper degree of physical strength and may be often damaged or injured when the circuit device is handled.

For solving the foregoing problems, a BGA (ball grid array) package has been developed for protecting the circuit device. In such a BGA package, connecting leads are provided as spherical solder bumps which are arrayed in two dimensions over the lower surface of the device. Therefore, the density of the lead terminals is decreased to avoid damage to the lead terminals.

Figure 1:
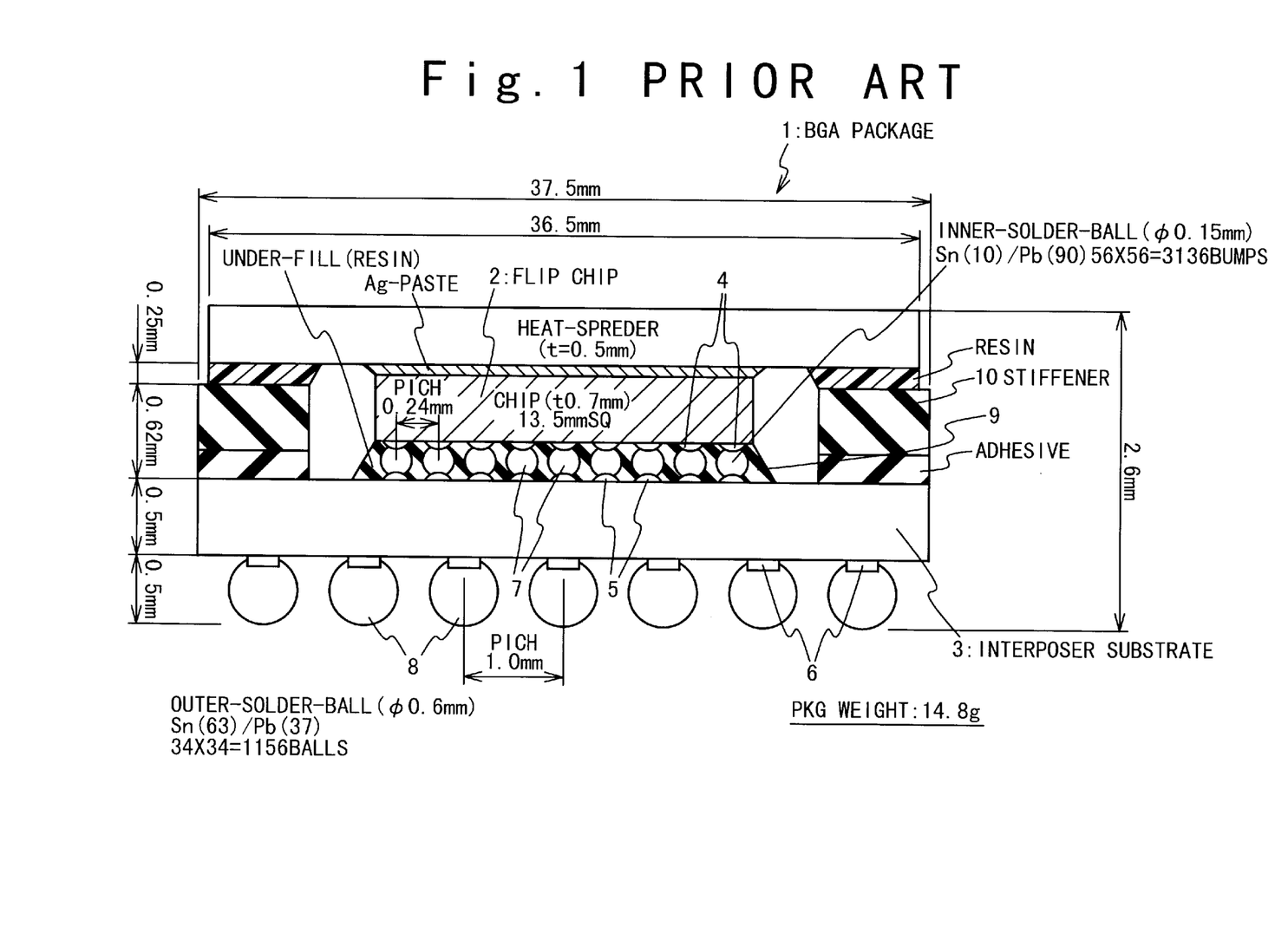
FIG. 1 is a schematic cross sectional view showing the structure of a conventional circuit device having a BGA package structure.
Figure 2:
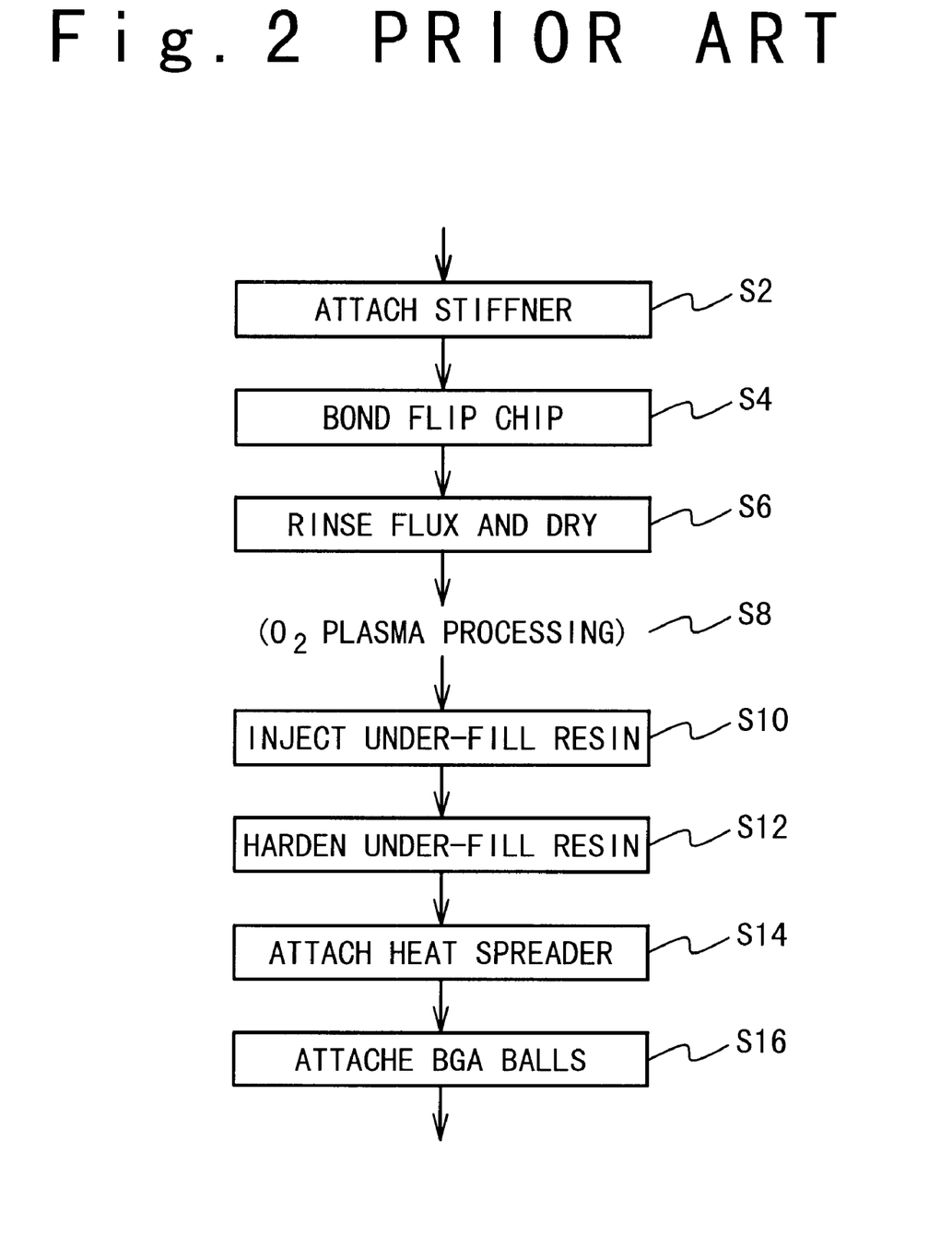
FIG. 2 is a schematic flowchart showing a conventional method of manufacturing the conventional circuit device having the BGA package structure.

An example of the conventional circuit device having such a BGA structure will be described with reference to FIGS. 1 and 2. FIG. 1 is a schematic cross sectional view of the internal structure of a BGA package in the circuit device. FIG. 2 is a flowchart schematically showing an example of the conventional method of manufacturing the BGA package. For simplification of the description, the upward and downward directions in the drawings shall represent the upward and downward directions on the circuit device.

As shown in FIG. 1, the BGA package 1 includes a flip chip 2 in which a semiconductor circuit is integrated in a high density. The flip chip 2 is mounted above the upper surface of an interposer substrate 3. The flip chip 2 has a multiplicity of connecting pads 4 provided on the lower surface thereof. Also, the interposer substrate 3 has a multiplicity of connecting pads 5 and 6 provided on the upper and lower surfaces thereof. More specifically, an array of the connecting pads 5 are mounted in a higher density on a central region of the upper surface of the interposer substrate 3 at the positions corresponding to the connecting pads 4 of the flip chip 2, while an array of the connecting pads 6 are mounted in lower density on substantially the entire lower surface of the interposer substrate 3. The interposer substrate 3 has a multi-layer structure in which printed wire patterns and through holes provided on its both surfaces and in the inside. The connecting pads 5 on the upper surface are connected to the connecting pads 6 on the lower surface by the printed wire patterns and the through holes.

The connecting pads 5 and 6 are coupled to solder bumps 7 and 8. By the solder bumps 7, the connecting pads 5 on the upper surface of the interposer substrate 3 are mechanically and electrically connected to the connecting pads 4 on the lower surface of the flip chip 2. The space between the solder bumps 7 is filled with an under-fill resin 9 of epoxy resin which enhances the mechanical coupling between the lower surface of the flip chip 2 and the upper surface of the interposer substrate 3.

The BGA package 1 of the example has side wall metal stiffeners 10 which are coupled to on the upper surface of the interposer substrate 3 in a peripheral portion of the flip chip 2. In addition, a top cover or metal heat spreader 11 is mounted over and joined to the upper surfaces of the stiffeners 10 and the flip chip 2 by resign and metal paste 12, respectively.

The flip chip 2 in the BGA package 1 of the conventional circuit device includes a high-density semiconductor circuit with the connecting pads 4 arrayed in the higher density. Each of the connecting pads 4 arrayed in the higher density on the lower surface of the flip chip 2 is connected by the solder bump 7 to corresponding one of the connecting pads 5 arrayed on the upper surface of the interposer substrate 3. The connecting pads 5 are in turn connected to their corresponding connecting pads 6 arrayed in a lower density on the lower surface of the interposer substrate 3. The connecting pads 6 arrayed in the lower density on the lower surface of the interposer substrate 3 in the BGA package 1 are preliminarily provided at their surfaces with solder bumps 8, respectively. This allows the circuit device to be surface-mounted to a circuit board (not shown) of an electronic instrument with ease on the user side, preventing its connecting leads from being physically injured and protecting the BGA package 1.

A conventional method of manufacturing the example of the BGA package will be described in brief. The method starts with preparing relevant components of the BGA package 1 including the flip chip 1, the interposer substrate 3, the stiffeners 10, and the heat spreader 11.

Next, the stiffeners 10 are bonded to the upper surface of the interposer substrate 3 in the peripheral portion and the flip chip 2 is mounted by the solder bumps 7 to the upper surface of the interposer substrate 3 in the central region. After flux is rinsed out, a resultant assembly is dried and subjected to $O_2$ plasma process. The space between the flip chip 2 and the interposer substrate 3 is filled with epoxy resin. The epoxy resin is hardened to produce the under-fill resin 9.

Next, the upper surface of the flip chip 2 is coated by metal paste 12 while the upper surfaces of the stiffeners 10 are coated with an adhesive such as epoxy resin. Then, the heat spreader 11 is bonded to the flip chip 2 and the stiffeners 10. Finally, the connecting pads 6 on the lower surface of the interposer substrate 3 are joined with the solder bumps 8. Thus, the BGA package 1 is completed.

The BGA package 1 manufactured in the above manner has as connecting terminals, the solder bumps 8 arrayed in the lower density in two dimensions on the lower surface thereof. Accordingly, the BGA package 1 can easily be surface-mounted to a printed circuit board on the user side while its connecting terminals are hardly injured.

However, as described above, the under-fill resin 9 filled for enhancing the mechanical bonding strength between the flip chip 2 and the interposer substrate 3 during the fabrication of the BGA package 1. For this filling, a considerable length of time is required for the epoxy resin of a high viscosity to infiltrate into the space by its capillary effect. At this time, the contact area of the under-fill resin 9 with the flip chip 2 and the interposer substrate 3 may not be enough large to increase the coupling strength.

Also, in the above BGA package 1, the interposer substrate 3 and the stiffeners 10 are separately manufactured, and then coupled to each other by the epoxy resin. Then, the heat spreader 11 is coupled to the stiffeners 10 by the epoxy resin. As a result, both the number of manufacturing steps and the number of components are increased, resulting in low productivity. Moreover, the interposer substrate 3, the stiffeners 10, and the heat spreader 11 are joined in a sequence as described above. This may discourage the mechanical bonding strength. As the number of bonding locations is increased, the probability of peeling-off and defect may not be decreased.

Also, the heat spreader 11 of a flat sheet is mounted to the upper surfaces of the flip chip 2 and the stiffeners 10. For the purpose, it is ssential that the surface of the flip chip 2 is aligned with the surfaces of the stiffeners 10. Hence, the productivity of the BGA package 1 is also reduced.

Since the flip chip 2 and the stiffener 10 are separately manufactured as different components, there is sometimes a case that the surface of the flip chip 2 is aligned with the surfaces of the stiffener 10. At that time, they may hardly be coupled at desired accuracy with the heat spreader 11, resulting in causing fabrication fault.

In conjunction with the above description, a chip size package is disclosed in Japanese Laid Open Patent Application (JP-A-Heisei 9-064236). In this reference, a chip (10) is flip-chip-connected to a laminate based substrate (20) with the same size as the chip (10) through direct through-holes (30). A gap between the chip (10) and the substrate (20) is filled with an under-fill (40), and the chip (10) is connected to external terminals (50) through the wiring lines (21 to 24) and via-holes (31). Then, a surface of the substrate is covered by encapsulant (60) other than openings (61). Thus, a high density area array connection is made possible, and delay and noise are reduced through use of low dielectric constant material and shortening of internal wiring length. Also, endurance and humidity resistance are improved by the under-fill and encapsulant.

Also, a semiconductor device is disclosed n Japanese Laid Open Patent Application (JP-A-Heisei 9-293808). In this reference, a semiconductor chip (2) is mounted on a circuit substrate (3) using flip chip bonding technique. A heat emitting fin (4) is provided to be thermally connected to the semiconductor chip (2). Supporting members (6) are provided in a peripheral portion of the portion of the substrate (3) where the semiconductor chip (2) is mounted. The heat emitting fin (4) is supported by the supporting members (6) and the semiconductor chip (2).

Also, a semiconductor device is disclosed in Japanese Laid Open Patent Application (JP-A-Heisei 11-097570). In this reference, a semiconductor chip (1) has a main surface on which a semiconductor circuit is formed, and gold bumps (39 are formed. A metal piece (2a) has a connection terminal section (2b) electrically connected to the gold bump (3) and an external terminal section (2c) electrically connected to the connection terminal section (2b). A sealing section (4) is used to seal the semiconductor chip (1) and the gold bumps (3). Thus, the semiconductor chip (1) is flip-chip-connected to the metal pieces (2a) via the gold bumps (3).

SUMMARY OF THE INVENTION

Therefore, an object of the present invention is to provide a circuit device in which the number of relevant components can be reduced so that the productivity of the circuit device is improved.

Another object of the present invention is to provide a circuit device in which the junction strength between a flip chip and an interposer substrate can be increased.

Still another object of the present invention is to provide a circuit device in which the junction strength between an interposer substrate and a heat spreader can be increased.

Yet still another object of the present invention is to provide a circuit device in which a heat spreader is held by mold resin.

It is also an object of the present invention to provide a method of manufacturing any of the above mentioned circuit devices.

In order to achieve an aspect of the present invention, a circuit device with a ball grid array (BGA) package structure includes an interposer substrate, at least a flip chip, a unitary mold resin and a heat spreader. The interposer substrate has a plurality of first connecting pads arrayed on an upper surface thereof in a first density. The flip chip has a plurality of second connecting pads arrayed on a lower surface thereof in the first density, and is mounted on the interposer substrate via solder bumps for connecting the plurality of first connecting pads and the plurality of second connecting pads. The unitary mold resin fills a space between the lower surface of the flip chip and the upper surface of the interposer substrate and peripheral portions of the flip chip on the upper surface of the interposer substrate. The heat spreader has a lower surface coupled to an upper surface of the flip chip and upper surfaces of the peripheral portions.

The interposer substrate has a plurality of third connecting pads arrayed on a lower surface thereof in a second density lower than the first density, and solder balls are connected to the plurality of third connecting pads.

Also, the heat spreader may be coupled to the flip chip with metal paste and the upper surfaces of the peripheral portions with resin. Alternatively, the heat spreader may be coupled to the flip chip with metal paste and directly coupled to the upper surfaces of the peripheral portions. Instead, the heat spreader may be directly coupled to the flip chip and the upper surfaces of the peripheral portions.

Also, the heat spreader may be smaller than the interposer substrate in size. In this case, the heat spreader is desirably connected to the unitary mold resin at side surfaces of the heat spreader. In addition, the heat spreader is desirably covered with a portion of the unitary mold resin at edge portions of an upper surface of the heat spreader.

Also, it is desirable that the heat spreader has small openings on the lower surface thereof, and the small openings are filled with a part of the unitary mold resin. Also, the heat spreader has a plurality of recess portions on the lower surface thereof, and the plurality of recess portions are filled with a part of the unitary mold resin.

In another aspect of the present invention, a method of manufacturing a circuit device with a ball grid array (BGA) package structure, is attained by mounting at least a flip chip on an interposer substrate via solder bumps which connect a plurality of first connecting pads and a plurality of second connecting pads to produce a mounted assembly, wherein the plurality of first connecting pads are provided on an upper surface of the interposer substrate and the plurality of second connecting pads are provided on a lower surface of the flip chip; by setting the mounted assembly in a cavity formed by molds such that an upper surface of the flip chip and the lower surface of the interposer substrate are in contact with walls of the cavity; by forming a unitary mold resin by injecting a resin into the cavity such that the resin fills a space between the lower surface of the flip chip and the upper surface of the interposer substrate and peripheral portions of the flip chip on the upper surface of the interposer substrate; and by coupling a heat spreader to the upper surface of the flip chip and upper surfaces of the peripheral portions.

When the interposer substrate has a plurality of third connecting pads arrayed on a lower surface thereof, the method may further include: connecting solder balls to the plurality of third connecting pads.

Also, the coupling includes: coupling the heat spreader to the flip chip with metal paste and the upper surfaces of the peripheral portions with resin.

Also, when the heat spreader has small openings on the lower surface thereof, the forming may include: filling the small openings with the resin.

Also, when the heat spreader has a plurality of recess portions on the lower surface thereof, the forming may include: filling the plurality of recess portions with the resin.

In still another aspect of the present invention, a method of manufacturing a circuit device with a ball grid array (BGA) package structure, is attained by mounting at least a flip chip on an interposer substrate via solder bumps which connect a plurality of first connecting pads and a plurality of second connecting pads, wherein the plurality of first connecting pads are provided on an upper surface of the interposer substrate and the plurality of second connecting pads are provided on a lower surface of the flip chip; by coupling a heat spreader to the upper surface of the flip chip to produce a mounted assembly; by setting the mounted assembly in a cavity formed by molds such that an upper surface of the flip chip and the lower surface of the interposer substrate are in contact with walls of the cavity; and by forming a unitary mold resin by injecting a resin into the cavity such that the resign fills a space between the lower surface of the flip chip and the upper surface of the interposer substrate and peripheral portions of the flip chip on the upper surface of the interposer substrate.

Here, when the interposer substrate has a plurality of third connecting pads arrayed on a lower surface thereof, the method may further includes: connecting solder balls to the plurality of third connecting pads.

Also, the coupling may include: coupling heat spreader to the upper surface of the flip chip with metal paste. Instead, the heat spreader may be directly coupled to the flip chip and the upper surfaces of the peripheral portions.

Also, when the heat spreader is smaller than the interposer substrate in size, the heat spreader is connected to the unitary mold resin at side surfaces of the heat spreader. In this case, the heat spreader may be covered with a portion of the unitary mold resin at edge portions of an upper surface of the heat spreader. Also, when the heat spreader has small openings on the lower surface thereof, the forming may include: filling the small openings with the resin.

Also, when the heat spreader has a plurality of recess portions on the lower surface thereof, the forming may include: filling the plurality of recess portions with the resin.

DESCRIPTION OF THE PREFERRED EMBODIMENTS

Hereinafter, a circuit device of the present invention will be described below in detail with reference to the attached drawings.

Figure 3:
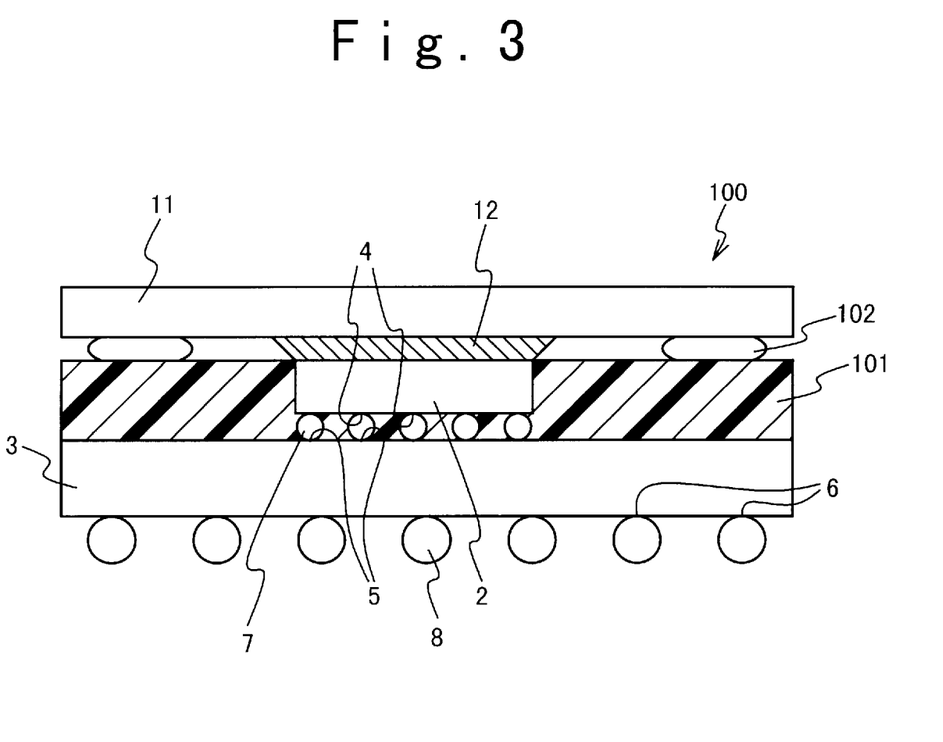
FIG. 3 is a cross sectional view showing the structure of a circuit device having a BGA package structure according to a first embodiment of the present invention.
Figure 4:
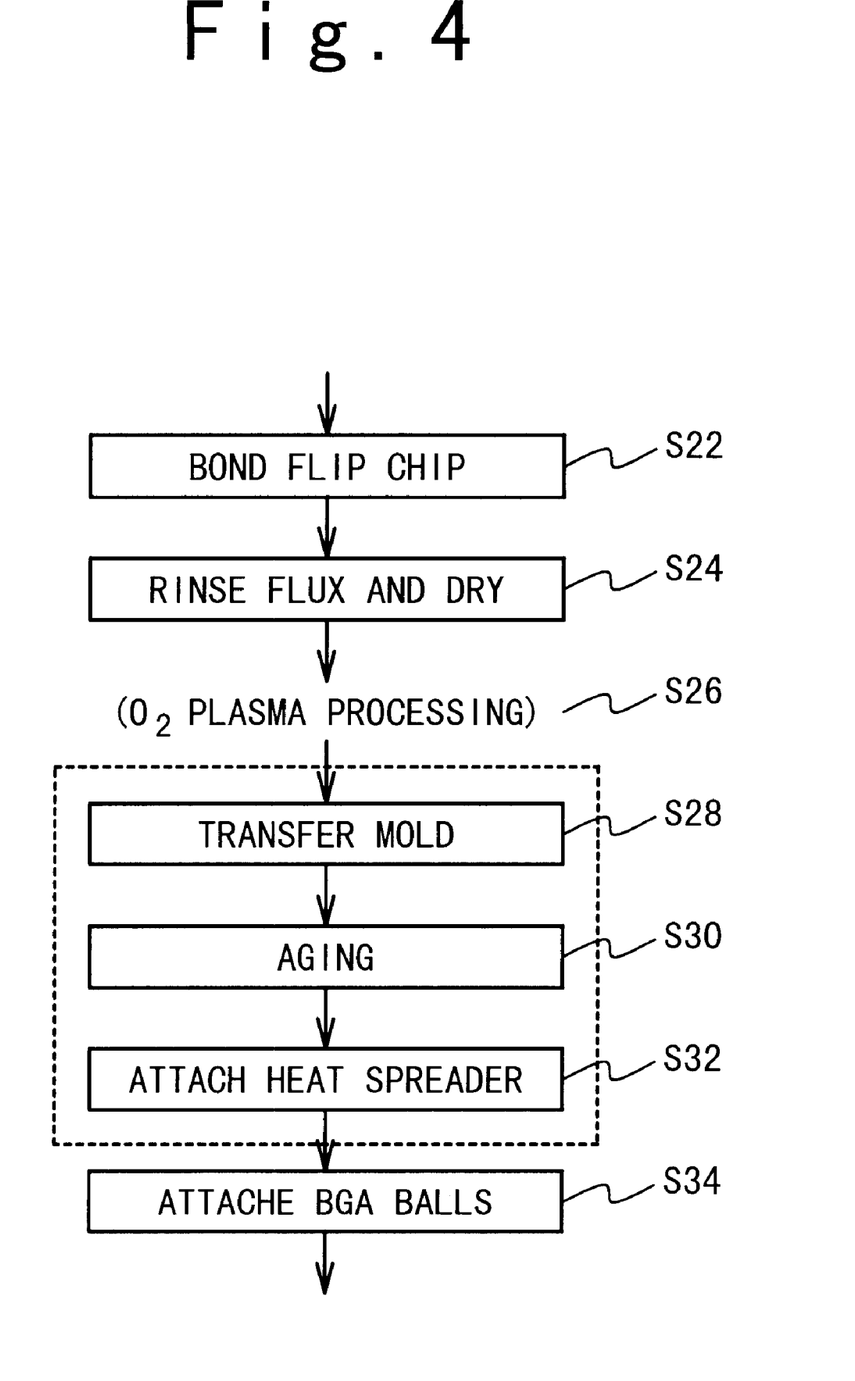
FIG. 4 is a schematic flowchart showing a method of manufacturing the circuit device having the BGA package.

FIG. 3 shows the structure of the circuit device 100 with a BGA package structure according to the first embodiment of the present invention. As shown in FIG. 3, the BGA package 1 includes a flip chip 2 in which a semiconductor circuit is integrated in a high density. The flip chip 2 is mounted above the upper surface of an interposer substrate 3. The flip chip 2 has a plurality of connecting pads 4 provided on the lower surface thereof. Also, the interposer substrate 3 has a plurality of connecting pads 5 and 6 provided on the upper and lower surfaces thereof, respectively. More specifically, an array of the connecting pads 5 are mounted in a higher density on a central region of the upper surface of the interposer substrate 3 at the positions corresponding to the connecting pads 4 of the flip chip 2. On the other hand, an array of connecting pads 6 are mounted in lower density on substantially the entire lower surface of the interposer substrate 3. The interposer substrate 3 has a multi-layer structure in which printed wiring patterns and through-holes provided on its both surfaces and in the inside. The connecting pads 5 on the upper surface are connected to the connecting pads 6 on the lower surface by the printed wiring patterns and the through-holes.

The connecting pads 5 and 6 are coupled to solder bumps 7 and 8. By the solder bumps 7, the connecting pads 5 on the upper surface of the interposer substrate 3 are mechanically and electrically connected to the connecting pads 4 on the lower surface of the flip chip 2. A heat spreader 11 is coupled to the upper surface of the flip chip 2 by metal paste 12 of silver.

Unlike the conventional circuit device shown in FIG. 1, in the circuit device 100 with the BGA package structure in the first embodiment, the space between the lower surface of the flip chip 2 and the upper surface of the interposer substrate 3 is filled with mold resin 101. The mold resin 101 is formed by use of transfer molding of an epoxy resin material. The mold resin 101 also fills the peripheral portions around the flip chip 2 on the upper surface of the interposer substrate 3. More particularly, the circuit device 100 with the BGA package structure in the first embodiment is not provided with an under-fill and stiffeners. Their functions are substituted with the unitary mold resin 101. The lower surface of the heat spreader 11 is coupled with the upper surface of the flip chip 2 with silver paste 12. Also, the lower surface of the heat spreader 11 is coupled to the upper surface of the mold resin 101 with adhesive 102 such as resin.

Next, the method of manufacturing the circuit device 100 with the BGA package structure in the first embodiment will be described below.

In this method, molds 111 and 112 are provided in such a manner that they can be engaged with and released from each other. A plunger unit (not shown) is coupled to a nozzle 113 provided in the mold 111. As shown in FIG. 5D, a cavity 110 is formed on the side of the mold 111 and fits with the circuit device 100.

In this embodiment, the components for the circuit device 100 with the BGA package such as the flip chip 2 and the interposer substrate 3 are manufactured but the stiffeners are not involved in the components.

Figure 5A:
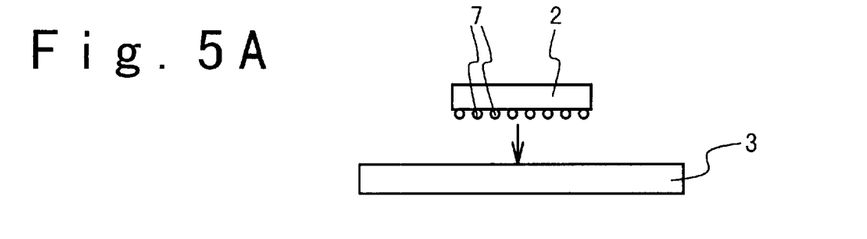
FIGS. 5A to 5G are cross sectional views of the circuit device in the manufacturing method according to a first embodiment of the present invention.
Figure 5B:
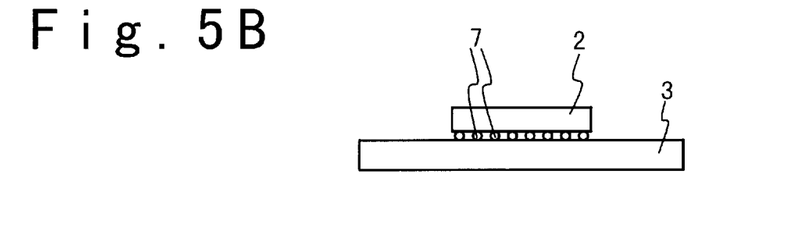

First, as shown in FIGS. 5A and 5B, the flip chip 2 is mounted to the upper surface of the interposer substrate 3 by bonding connection of the solder bumps 7 (Step S22). Then, a resultant assembly is rinsed to remove flux and dried (Step S24). Subsequently, $O_2$ plasma process is carried out in the same manner as the conventional technique to improve the wetting property of the components, especially the interposer substrate 3.

Figure 5C:
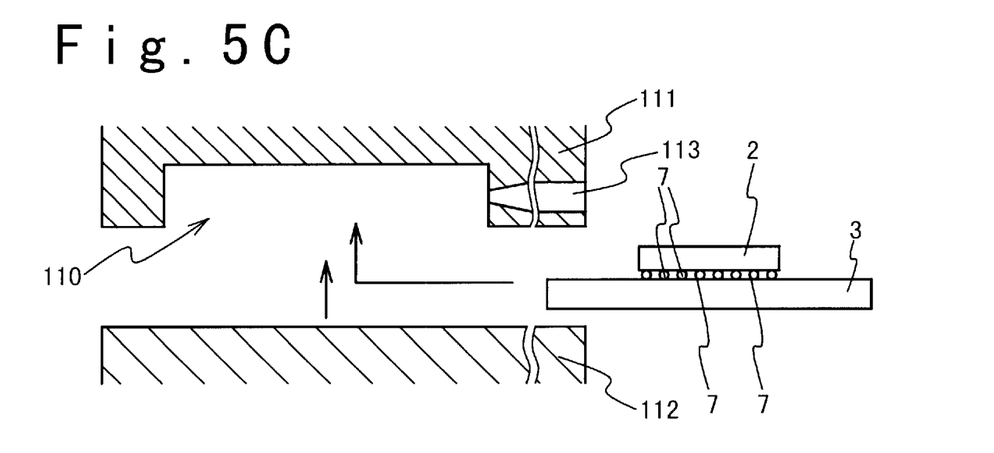
Figure 5D:
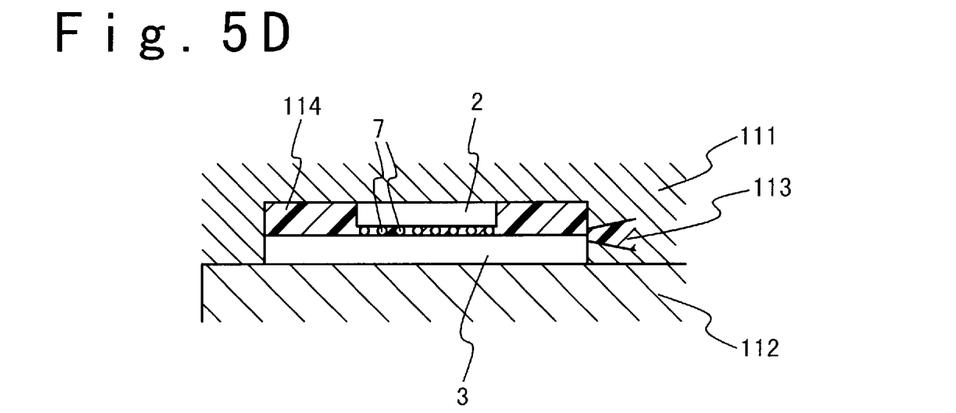

Next, as shown in FIG. 5C, the molds 111 and 112 are released, and the above resultant assembly of the flip chip 2 and the interposer substrate 3 is placed in the cavity 110 of the mold 111 (Step S28). Then, as shown in FIG. 5D, the molds 111 and 112 are closed to each other so that the upper surface of the flip chip 2 and the lower surface of the interposer substrate 3 come into contact with the inner surfaces of the cavity 110. In this case, a thin film (not shown) is provided for at least one of the upper surface of the flip chip 2 and the lower surface of the interposer substrate 3. Therefore, even if the resultant assemblies are different in the height from the lower surface of the interposer substrate 3 to the upper surface of the flip chip 2, the difference can be cancelled or absorbed by the thin film. Also, the inclination of the upper surface of the flip chip 2 with respect to the lower surface of the interposer substrate 3 can be cancelled or absorbed by the thin film. Therefore, there is no case that the lower surface of the interposer substrate 3 and the upper surface of the flip chip 2 are covered with epoxy resin.

Next, the cavity 110 in the closed molds 111 and 112 is filled with a molten form of epoxy resin 114 injected under pressure. Thus, the epoxy resin 114 fills the space between the lower surface of the flip chip 2 and the upper surface of the interposer substrate 3 and seals the peripheral portions around the flip chip 2 on the upper surface of the interposer substrate 3. Then, the epoxy resin 114 is hardened to a solid mold resin 101 (Step S30).

Figure 5E:
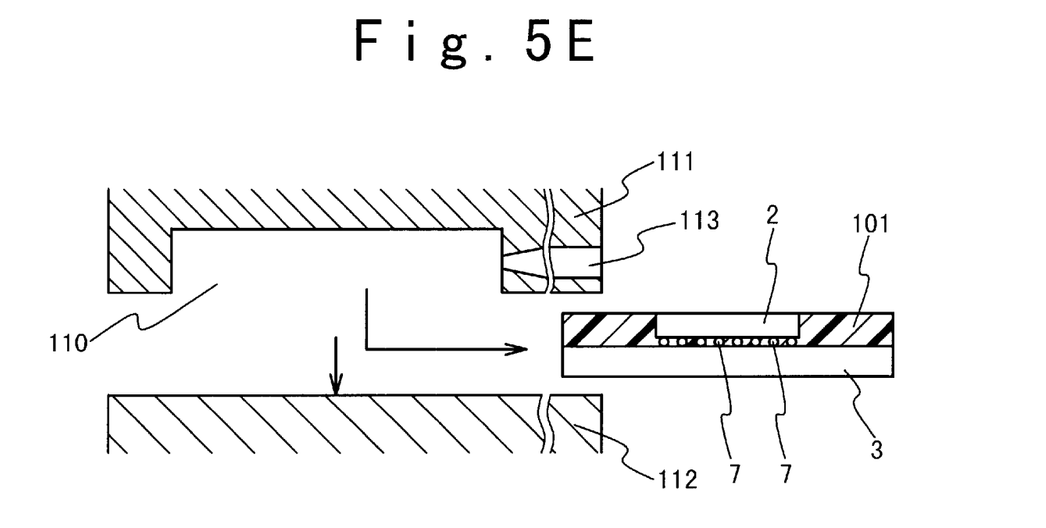
Figure 5F:
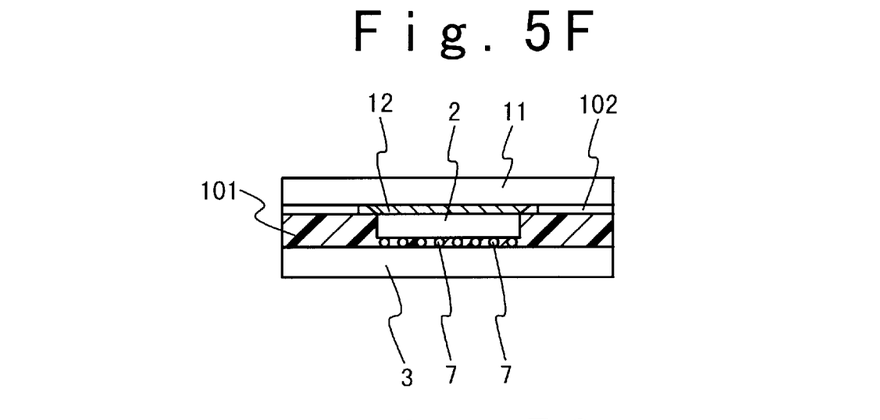
Figure 5G:
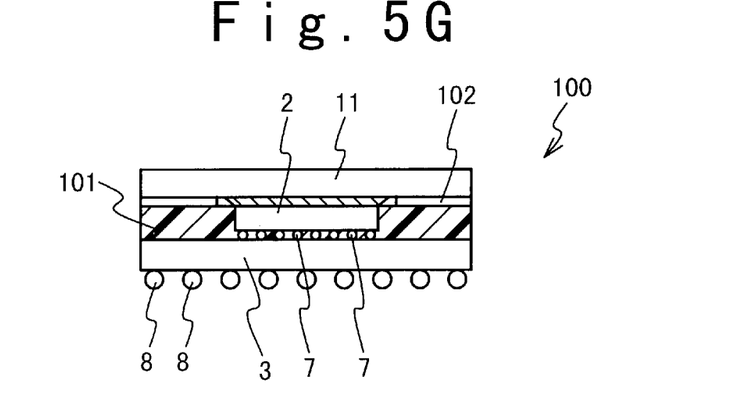

Next, as shown in FIG. 5E, when the molds 111 and 112 are separated open, the molded assembly with the mold resin 101 is taken out from the molds 111 and 112. The upper surface of the flip chip 2 and the upper surface of the mold resin 101 are aligned with each other because they are defined by the inner wall of the mold 111. Then, as shown in FIG. 5F, a heat spreader 11 is attached to the molded assembly at the upper surface of the flip chip 2 and the peripheral portion using silver paste 12 and adhesive 102 of epoxy resin (Step S32). Finally, as shown in FIG. 5G, solder bumps 8 are coupled with the connecting pads 6 provided on the lower surface of the interposer substrate 3, respectively, in the same manner as the conventional technique (Step S34). Thus, the circuit device 100 with the BGA package in the first embodiment is completed.

In the BGA package 100 of the embodiment like the BGA package 1 of the prior art, the connecting pads 4 arrayed at higher density on the lower surface of the flip chip 2 are connected to their corresponding connecting pads 6 arrayed at lower density on the lower surface of the interposer substrate 6. The connecting pads 6 are further connected to their corresponding solder bumps 8. Accordingly, the circuit device 100 with the BGA package structure can easily be handled for surface mounting at the user side without injuring its connecting terminals.

In the circuit device 100 with the BGA package in the first embodiment, the connection pads 4 formed in the high density on the lower surface of the flip chip 2 are connected to the connection pads 6 formed in the low density on the lower surface of the interposer substrate 3, like the conventional BGA package 1. The solder bumps 8 are connected to the connection pads 6 so that the user can surface-mount the circuit device 100 easily without failure of connection terminals.

However, in the circuit device 100 with the BGA package structure in the first embodiment, the solid mold resin 101 fills up the space between the lower surface of the flip chip 2 and the upper surface of the interposer substrate 3 and seals the peripheral portion around the flip chip 2 on the upper surface of the interposer substrate 3, unlike the conventional BGA package 1. In other words, the solid mold resin 101 is in contact with both the flip chip 2 and the interposer substrate 3 in a wider area. Therefore, the mechanical bonding strength between the flip chip 2 and the interposing substrate 3 can be increased. Also, the solid mold resin 101 holds the peripheral portion of the flip chip 2. Therefore, its contact area of the mold resin 101 with the heat spreader 11 is greater than the conventional circuit device 1, resulting in improve the bonding strength. In the conventional circuit device 1, the epoxy resin of a high viscosity is infiltrated by its capillary effect into the space between the flip chip 2 and the interposer substrate 3. However, in the first embodiment, the solid mold resin 101 is formed by use of transfer molding. Therefore, the overall time required for the production can be reduced, resulting in increasing the productivity.

The inventors conducted some experiments of the models sized as shown in FIG. 1. As a result, It was found that the solid mold resin 101 in the BGA package 100 in this embodiment was manufactured in as a shorter time as 15 seconds while the under-fill 9 in the conventional BGA package 1 took 75 seconds for fabrication.

This is because the solid mold resin 101 bonds the flip chip 2 to the interposer substrate 3 at the same time that it is injected by use of the transfer molding. Therefore, the productivity of the circuit device 100 with the BGA package structure in this embodiment can be improved. Also, since the solid mold resin 101 serves as both the under-fill and the stiffeners, the step of filling the space between the lower surface of the flip chip 2 and the upper surface of the interposer substrate 3 with the under-fill resin and the step of mounting the stiffeners on the upper surface of the interposer substrate 3 can be eliminated. In other words, components and one step of mounting are eliminated from the conventional method so that the productivity of the circuit device 100 with the BGA package structure in this embodiment will be improved.

As described above, in the method of manufacturing the circuit device 100 with the BGA package structure in this embodiment, the upper surface of the flip chip 2 is in contact with the inner wall of the cavity 110 of the mold 111. Therefore, the upper surface of the flip chip 2 is not covered with the solid mold resin 101 and is aligned with the upper surface of the solid mold resin 101. Similarly, while the solid mold resin 101 is developed by the transfer molding, the lower surface of the interposer substrate 3 is in contact with the inner wall of the lower mold 112. This allows the lower surface of the interposer substrate 3 to be exposed but not coveted with the solid mold resin 101. Accordingly, the upper surface of the flip chip 2 and the lower surface of the interposer substrate 3 can never be sealed or covered with the solid mold resin 101 developed by the transfer molding. Thus, an extra step of cutting or grounding off an excess of the solid mold resin 101 will be eliminated. In particular, the method of manufacturing the circuit device 100 with the BGA package structure allows the upper surface of the flip chip 2 to be aligned with the upper surface of the solid mold resin 101. Thus, the heat spreader 11 can be bonded to the upper surface of the flip chip 2 at an optimum condition.

Figure 6:
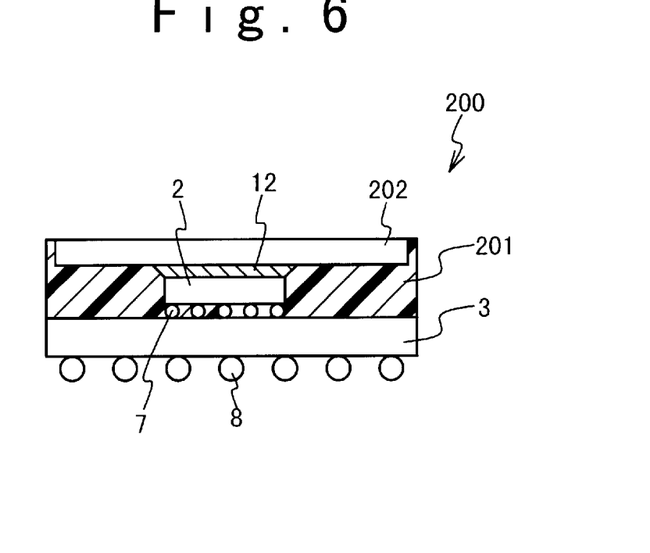
FIG. 6 is a cross sectional front view showing the structure of the circuit device having the BGA package structure according to a second embodiment of the present invention.
Figure 7:
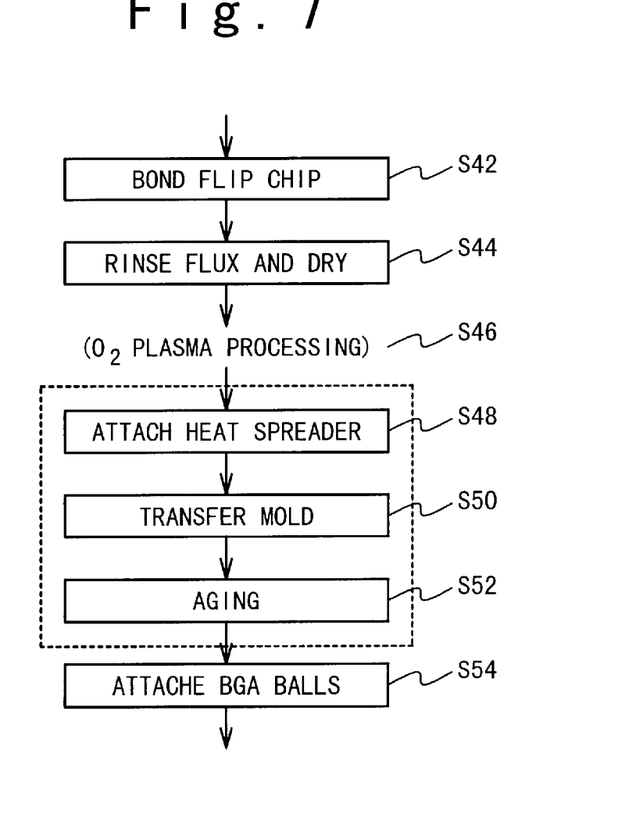
FIG. 7 is a schematic flowchart showing a method of manufacturing the circuit device having the BGA package structure in the second embodiment.

Next, the circuit device 200 with the BGA package structure according to the second embodiment of the present invention will now be described referring to FIGS. 6 and 7. In FIGS. 6 and 7, the same components as in the first embodiment are allocated with the same reference numerals as in the first embodiment.

As shown in FIG. 6, in the circuit device 200 with the BGA package structure in the second embodiment, the space between the lower surface of a flip chip 2 and the upper surface of an interposer substrate 3 is filled with a mold resin 201 of epoxy resin injected by transfer molding, like the circuit device 100 with the BGA package structure of the first embodiment. The solid mold resin 201 also fills up the space between the lower surface of a heat spreader 202 and the upper surface of the interposer substrate 3 around the flip chip 2. However, the circuit device 200 with the BGA package structure in the second embodiment is different from the circuit device 100 with the BGA package structure in the first embodiment in the following point. That is, the heat spreader 202 is slightly reduced in the horizontal direction so that its edge is encompassed by the mold resin 201.

A method of manufacturing the circuit device 200 with the BGA package structure in the second embodiment will be described below with reference FIG. 7. A pair of molds 111 and 112 whose cavity 110 is tailored to match the shape of the mold resin 101. Also, the various components such as the flip chip 2 and the interposer substrate 3 are prepared to have their desired structure. As shown in FIG. 7, a step (S42) is carried out to bond the flip chip 2 to the interposer substrate 3 by solder bumps 7. Then a step (S44) is carried out to rinse flux, and a step (S46) is carried out for $O_2$ plasma processing.

Subsequently, a step (S48) is carried out to bond the heat spreader 202 to the upper surface of the flip chip 2 by metal paste 12 of silver. This bonding operation is followed by opening the molds 111 and 112. Then, the resultant bonded assembly of the heat spreader 202, the flip chip 2, and the interposer substrate 3 is placed in the cavity 110 formed by the molds 111 and 112. Then, the molds 111 and 112 are closed so that the upper surface of the heat spreader 202 and the lower surface of the interposer substrate 3 come into contact with the inner wall of the cavity 110.

Then, the cavity 110 in the closed molds 111 and 112 is filled with a molten form of epoxy resin 114 injected under pressure (Step S50). When the epoxy resin 114 is injected, the mold resin fills up the space between the lower surface of the flip chip 2 and the upper surface of the interposer substrate 3 and simultaneously the space between the lower surface of the heat spreader 202 and the upper surface of the interposer substrate 3 around the flip chip 2. Also, the mold resin seals the side portion of the head spreader 202. Then, the mold resin is hardened to the solid mold resin 201 (Step S52).

When the molds 111 and 112 are separated open, a mold assembly of the flip chip 2, the interposer substrate 3, and the heater spreader 202 is taken out from the molds 111 and 112. Then, solder bumps 8 are coupled with the connecting pads 6 provided on the lower surface of the interposer substrate 3, respectively, in the same manner as of the first embodiment (Step S54).

In the circuit device 200 with the BGA package structure in the second embodiment, the space between the lower surface of the flip chip 2 and the upper surface of the interposer substrate 3 is filled with the solid mold resin 201. Also, the side surfaces of the flip chip 2 and the upper surface of the interposer substrate 3 are sealed. Therefore, the mechanical bonding strength between the flip chip 2 and the interposer substrate 3 is increased, like the circuit device 100 with the BGA package structure of the first embodiment.

However, in the circuit device 200 with the BGA package structure in the second embodiment, the mold resin 201 is bonded to the heat spreader 202 during the transfer molding, unlike the circuit device 100 with the BGA package structure of the first embodiment. Accordingly, an extra step of joining the heat spreader 202 to the mold resin 201 is unnecessary and the productivity of the circuit device 200 with the BGA package structure in the second embodiment can hence be improved. In particular, the mold resin 201 holds the edge portions of the heat spreader 202 while is firmly bonded to the heat spreader 202. Also, the above structure can be implemented by slightly reducing the size of the heat spreader 202. Accordingly, an extra structure for forming a dedicated recess in the cavity 110 of the mold 111 is unnecessary and the productivity of the circuit device 200 with the BGA package structure of this embodiment can be improved.

Moreover, in the method of manufacturing the circuit device 200 with the BGA package structure in the second embodiment, the upper surface of the heat spreader 202 is placed in direct contact with the inner wall of the cavity 110 of the mold 111 when the solid mold resin 201 is developed by the transfer molding. Accordingly, the upper surface of the heat spreader 202 is exposed but not covered with the mold resin 201. While the solid mold resin 201 is developed by the transfer molding, the upper surface of the heat spreader 202 remains uncovered and any extra step of cutting or grinding off an excess of the mold resin 201 will be unnecessary.

Figure 8:
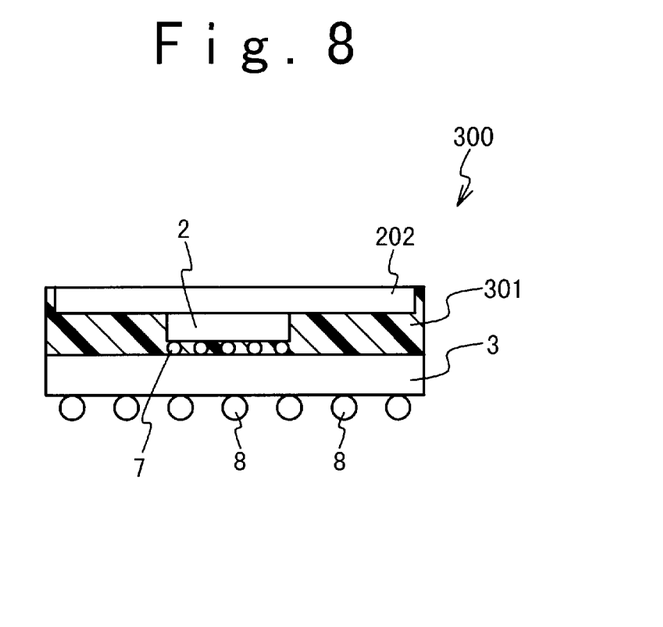
FIG. 8 is a cross sectional front view showing the structure of the circuit device having the BGA package structure according to a third embodiment of the present invention.
Figure 9:
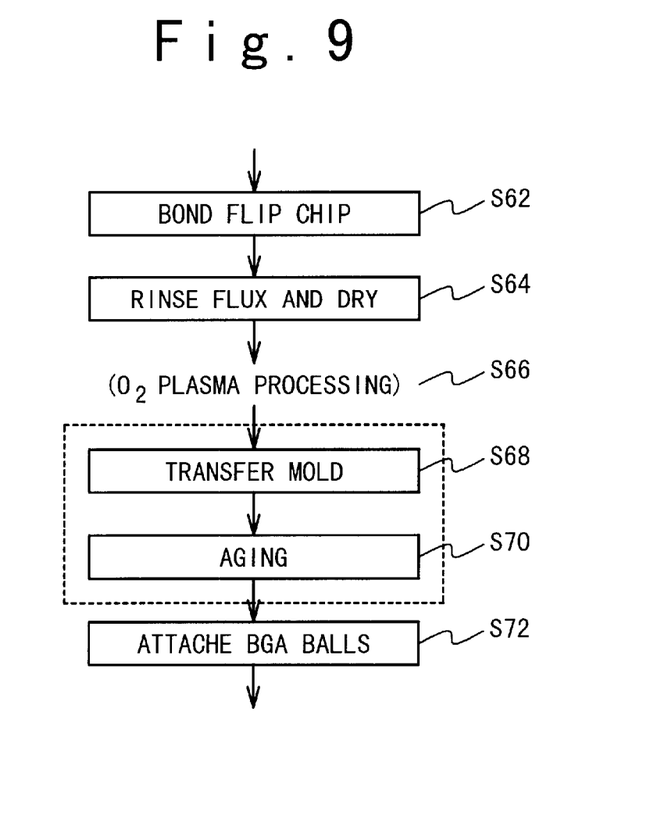
FIG. 9 is a schematic flowchart showing a method of manufacturing the circuit device having the BGA package structure in the third embodiment.

It should be understood that the present invention is not limited to the described embodiments and other changes and modifications may be possible without departing from the scope of the present invention. In the circuit device 200 with the BGA package structure in the second embodiment, the heat spreader 202 is held by the solid mold resin 201, and is also bonded to the flip chip 2 by the metal paste 12, resulting in improving the bonding strength as well as the dissipation of heat. However, for example, this may be modified to a circuit device 300 with the BGA package structure in the third embodiment, as shown in FIGS. 8 and 9. In this example, the heat spreader 202 is directly fixed to the flip chip 2 by a solid mold resin 301 without using the metal paste 12. Therefore, in FIG. 9, the step of bonding the heat spreader 202 to the flip chip by metal paste 12 is omitted, compared with the flow chart of FIG. 7.

Figure 10:
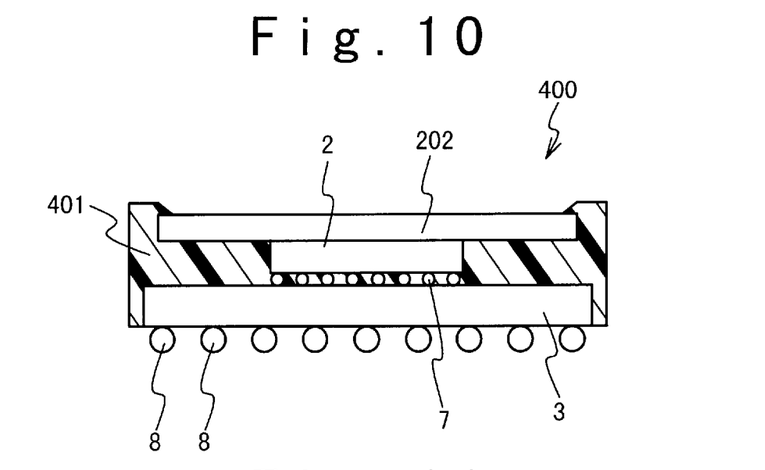
FIG. 10 is a cross sectional front view showing the structure of the circuit device having the BGA package structure according to a fourth embodiment of the present invention.

Also, in the circuit devices with the BGA package structures 200 and 300, the solid mold resins 201 and 301 are developed up to the upper edge of the heat spreader 202 to hold all the side surfaces of the heat spreader 202. However, as a modified circuit device 400 with the BGA package structure in the fourth embodiment shown in FIG. 10, a mold resin 401 may be developed to cover the side edge surfaces of the heat spreader 202 for further increasing the joining strength between the mold resin 401 and the heat spreader 202. For developing a shape of the mold resin 401, the mold 111 is modified to have a corresponding recess about the cavity 110 (not shown).

Figure 11:
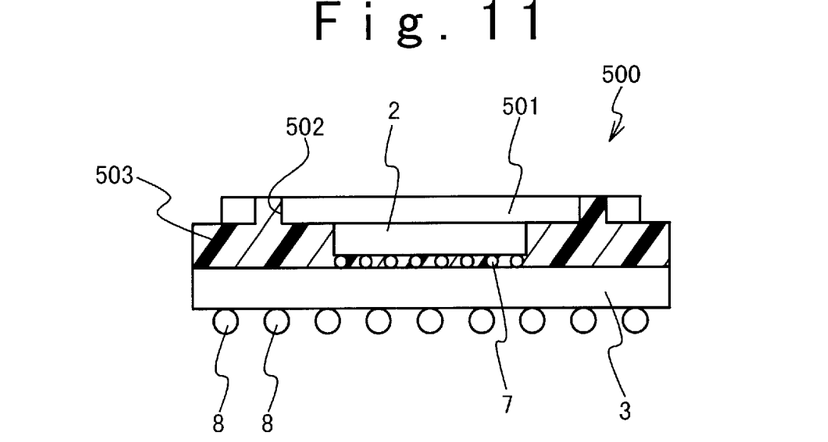
FIG. 11 is a cross sectional front view showing the structure of the circuit device having the BGA package structure according to a fifth embodiment of the present invention.
Figure 12:
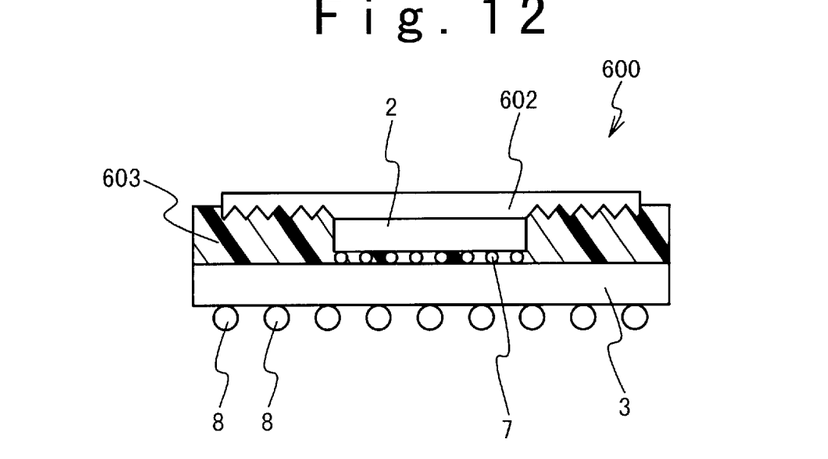
FIG. 12 is a cross sectional front view showing the structure of the circuit device having the BGA package structure according to a sixth embodiment of the present invention.

Also, as another modified circuit device 500 with the BGA package structure in the fifth embodiment shown in FIG. 11, a heat spreader 501 may have small openings 502 provided therein to extend consistently from the lower surface to the upper surface and filled with mold resin 503. Moreover, a further modified circuit device 600 with the BGA package structure in the sixth embodiment shown in FIG. 12, a heat spreader 601 has a plurality of recesses 602 provided on the lower surface thereof and filled with mold resin Depending on applicable conditions such as manufacturing techniques, the scheme of modifying the mold 111 as in the circuit device 400 with the BGA package structure is advantageous particularly in the mass production. On the other hand, the scheme of modifying the shape of components as in the circuit devices 500 and 600 with the BGA package structure is advantageous in the many-type s small-quantity production. An optimum structure of the BGA package can be implement e d by selecting the scheme for satisfying the requirements.

It should be noted that the fourth to sixth embodiments may be applied to the second and third embodiments.

As set forth above, according to the present invention, the following advantages are attained.

The circuit device of the first embodiment of the present invention allows the space between the lower surface of the clip chip and the upper surface of the interposer substrate to be filled with the unitary mold resin which also seals off the side surfaces of the flip chip on the upper surface of the interposer substrate.

As the unitary mold resin holds the flip chip and the interposer substrate at greater extension, it can improve the bonding strength between the flip chip and the interposer substrate. Since the unitary mold resin is developed by use of the transfer molding, a step of infiltrating the epoxy resin of a higher viscosity into the space between the flip chip and the interposer substrate by its capillary effect can be eliminated and the overall production time will hence be minimized thus increasing the productivity. The unitary mold resin upon developed by use of the transfer molding holds the flip chip and the interposer substrate. Accordingly, no step of joining the finished mold resin to the interposer substrate is needed during the fabrication and the productivity can thus be improved. As the unitary mold resin serves as both an under-fill and a stiffener, conventional separate steps of filling the space between the lower surface of the flip chip and the upper surface of the interposer substrate with an under-fill resin material and of bonding the stiffener to the upper surface of the interposer substrate can be eliminated. Accordingly, the overall procedure of the fabrication and the number of the components can significantly be minimized hence improving the productivity.

The circuit device of the another embodiment of the present invention allows the space between the lower surface of the flip chip and the upper surface of the interposer substrate to be filled with the unitary mold resin which also fills up the space between the lower surface of the heat spreader and the remaining of the upper surface of the interposer substrate.

As the unitary mold resin holds directly the flip chip and the interposer substrate at greater extension, it can improve the joining strength between the flip chip and the interposer substrate. Since the unitary mold resin is developed by the transfer molding, a step of infiltrating the epoxy resin of a higher viscosity into the space between the flip chip and the interposer substrate by its capillary effect can be eliminated and the overall production time will hence be minimized thus increasing the productivity. The unitary mold resin upon developed by use of the transfer molding holds the flip chip and the interposer substrate. Accordingly, no step of bonding the finished mold resin to the interposer substrate is needed during the fabrication and the productivity can thus be improved. As the unitary mold resin serves as both an under-fill and a stiffener, conventional separate steps of filling the space between the lower surface of the flip chip and the upper surface of the interposer substrate with an under-fill resin material and of bonding the stiffener to the upper surface of the interposer substrate can be eliminated. Accordingly, the overall procedure of the fabrication and the number of the components can significantly be minimized hence improving the productivity.

In addition, the heat spreader in the circuit device of the another embodiment is directly supported by the mold resin. Accordingly, an extra step of bonding the heat spreader to the mold resin is unnecessary and the productivity can further be improved.

Alternatively, the side surfaces of the heat spreader are held directly by the mold resin. Accordingly, as the heat spreader is securely held by the mold resin, the joining strength between the heat spreader and the mold resin can be increased.

Alternatively, the side surfaces and the edge of the upper surface of the heat spreader are held directly by the mold resin. Accordingly, as the heat spreader remains secured on the upper surface of the flip chip, its joining strength can further be increased.

Alternatively, the heat spreader has the recesses provided in the lower surface thereof and joined to their corresponding projections on the upper surface of the mold resin. Accordingly, the joining area between the heat spreader and the mold resin can be increased thus improving the joining strength of the heat spreader.

The first or second method of manufacturing the circuit device according to the present invention includes filling by the transfer molding the space between the lower surface of the flip chip and the upper surface of the interposer substrate with the unitary mold resin which also seals the side surfaces of the flip chip and the remaining of the upper surface of the interposer substrate. In the transfer molding, the upper surface of the flip chip and the lower surface of the interposer substrate come into direct contact with the inner wall of the cavity of the mold. Accordingly, the circuit device improved in the joining strength between the flip chip and the interposer substrate can be manufactured while the overall procedure and the number of the components are minimized and the productivity is thus increased. When the mold resin is developed by the transfer molding, the upper surface of the flip chip and the lower surface of the interposer substrate are definitely exposed but not covered with the mold resin and simultaneously, the flip chip and the mold resin are flush with each other at the upper surface. Accordingly, the heat spreader can be bonded at optimum conditions to the upper surfaces of the flip chip and the mold resin.

The third method according to the present invention includes filling the space between the lower surface of the flip chip and the upper surface of the interposer substrate and simultaneously the space between the lower surface of the heat spreader and the remaining of the upper surface of the interposer substrate with the unitary mold resin introduced by the transfer molding. In the transfer molding, the upper surface of the heat spreader and the lower surface of the interposer substrate come into direct contact with the inner wall of the cavity of the mold. Accordingly, the circuit device improved in the joining strength between the heat spreader, the flip chip, and the interposer substrate can be manufactured while the overall procedure and the number of the components are minimized and the productivity is thus increased. When the mold resin is developed by the transfer molding, the upper surface of the heat spreader and the lower surface of the interposer substrate are definitely exposed but not covered with the mold resin. As the bonding between the heat spreader and the mold resin is unnecessary, the productivity can further be improved.

The fourth method according to the present invention includes filling the space between the lower surface of the flip chip and the upper surface of the interposer substrate and simultaneously the space between the lower surface of the heat spreader and the remaining of the upper surface of the interposer substrate with the unitary mold resin introduced by the transfer molding. In the transfer molding, the upper surface of the heat spreader and the lower surface of the interposer substrate come into direct contact with the inner wall of the cavity of the mold. As the heater spreader, the flip chip, and the interposer substrate have been placed in the cavity of the molds, the mold resin is introduced and cured. Accordingly, the circuit device improved in the joining strength between the heat spreader, the flip chip, and the interposer substrate can be manufactured while the overall procedure and the number of the components are minimized and the productivity is thus increased. When the mold resin is developed by the transfer molding, the upper surface of the heat spreader and the lower surface of the interposer substrate are exposed easily and definitely. As the bonding between the heat spreader, the flip chip, and the mold resin is unnecessary, the productivity can further be improved.

In addition, each the method includes providing the recess in the cavity of the mold into which the molten resin material is introduced to cover the side surfaces and the edge of the upper surface of the heat spreader. Accordingly, as the side surfaces and the edge of the upper surface of the heat spreader are held directly by the mold resin, the joining strength between the heat spreader and the mold resin can be increased.

Alternatively, the recesses are provided in the lower surface of the heat spreader for receiving the molten resin material. Accordingly, as the recesses provided in the lower surface of the heat spreader are filled with the mold resin, the joining strength between the heat spreader and the mold resin can be increased.

What is claimed is:

1. A circuit device with a ball grid array (BGA) package structure, comprising:

an interposer substrate having a plurality of first connecting pads arrayed on an upper surface thereof in a first density;

a flip chip having a plurality of second connecting pads arrayed on a lower surface thereof in the first density, and mounted on said interposer substrate via solder bumps for connecting said plurality of first connecting pads and said plurality of second connecting pads;

a unitary mold resin filling a space between said lower surface of said flip chip and said upper surface of said interposer substrate and peripheral portions of said flip chip on said upper surface of said interposer substrate; and a heat spreader having a lower surface adhered directly to an upper surface of said flip chip with a metal paste and to upper surfaces of said peripheral portions.

2. A circuit with a BGA package structure according to claim 1, wherein said interposer substrate has a plurality of third connecting pads arrayed on a lower surface thereof in a second density lower than the first density, solder balls being connected to said plurality of third connecting pads.

3. A circuit with a BGA package structure according to claim 1, wherein said heat spreader is coupled to said upper surfaces of said peripheral portions with resin.

4. A circuit with a BGA package structure according to claim 1, wherein said heat spreader is directly coupled to said upper surfaces of said peripheral portions.

5. A circuit with a BGA package structure according to claim 1, wherein said heat spreader is smaller than said interposer substrate in size.

6. A circuit with a BGA package structure according to claim 5, wherein said heat spreader is connected to said unitary mold resin at side surfaces of said heat spreader.

7. A circuit with a BGA package structure according to claim 6, wherein said heat spreader is covered with a portion of said unitary mold resin at edge portions of an upper surface of said heat spreader.

8. A circuit with a BGA package structure according to claim 1, wherein said heat spreader has small openings on said lower surface thereof, and said small openings are filled with a part of said unitary mold resin.

9. A circuit with a BGA package structure according to claim 1, wherein said heat spreader has a plurality of recess portions on said lower surface thereof, and said plurality of recess portions are filled with a part of said unitary mold resin.

10. A method of manufacturing a circuit device with a ball grid array (BGA) package structure, comprising:

mounting at least a flip chip on an interposer substrate via solder bumps which connect a plurality of first connecting pads and a plurality of second connecting pads to produce a mounted assembly, wherein said plurality of first connecting pads are provided on an upper surface of said interposer substrate and said plurality of second connecting pads are provided on a lower surface of said flip chip;

setting said mounted assembly in a cavity formed by molds such that an upper surface of said flip chip and said lower surface of said interposer substrate are in contact with walls of said cavity;

forming a unitary mold resin by injecting a resin into said cavity such that said resin fills a space between said lower surface of said flip chip and said upper surface of said interposer substrate and peripheral portions of said flip chip on said upper surface of said interposer substrate; and directly coupling a heat spreader to said upper surface of said flip chip with a metal paste and coupling said heat spreader to upper surfaces of said peripheral portions.

11. A method according to claim 10, wherein said interposer substrate has a plurality of third connecting pads arrayed on a lower surface thereof, and wherein said method further comprises:
connecting solder balls to said plurality of third connecting pads.

12. A method according to claim 10, wherein said coupling includes:

coupling said heat spreader to said upper surfaces of said peripheral portions with resin.

13. A method according to claim 10, wherein said heat spreader has small openings on said lower surface thereof, and wherein said forming includes:
filling said small openings with said resin.

14. A method according to claim 10, wherein said heat spreader has a plurality of recess portions on said lower surface thereof, and wherein said forming includes:
filling said plurality of recess portions with said resin.

15. A method of manufacturing a circuit device with a ball grid array (BGA) package structure, comprising:

mounting at least a flip chip on an interposer substrate via solder bumps which connect a plurality of first connecting pads and a plurality of second connecting pads, wherein said plurality of first connecting pads are provided on an upper surface of said interposer substrate and said plurality of second connecting pads are provided on a lower surface of said flip chip;

directly coupling a heat spreader to said upper surface of said flip chip with a metal paste to produce a mounted assembly;

setting said mounted assembly in a cavity formed by molds such that an upper surface of said flip chip and said lower surface of said interposer substrate are in contact with walls of said cavity; and forming a unitary mold resin by injecting a resin into said cavity such that said resin fills a space between said lower surface of said flip chip and said upper surface of said interposer substrate and peripheral portions of said flip chip on said upper surface of said interposer substrate.

16. A method according to claim 15, wherein said interposer substrate has a plurality of third connecting pads arrayed on a lower surface thereof, and wherein said method further comprises:
connecting solder balls to said plurality of third connecting pads.

17. A method according to claim 15, wherein said heat spreader is directly coupled to said upper surfaces of said peripheral portions.

18. A method according to claim 15, wherein said heat spreader is smaller than said interposer substrate in size, and wherein said heat spreader is connected to said unitary mold resin at side surfaces of said heat spreader.

19. A method according to claim 18, wherein said heat spreader is covered with a portion of said unitary mold resin at edge portions of an upper surface of said heat spreader.

20. A method according to claim 15, wherein said heat spreader has small openings on said lower surface thereof, and wherein said forming includes:
filling said small openings with said resin.

21. A method according to claim 15, wherein said heat spreader has a plurality of recess portions on said lower surface thereof, and wherein said forming includes:
filling said plurality of recess portions with said resin.

* * * * *